United States Patent
Yu et al.

(10) Patent No.: US 10,533,563 B2
(45) Date of Patent: Jan. 14, 2020

(54) MANAGEMENT OF MULTIPLE FAN MODULES

(71) Applicant: QUANTA COMPUTER INC., Taoyuan (TW)

(72) Inventors: Chun-Ching Yu, Taoyuan (TW); Shuen-Hung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/895,360

(22) Filed: Feb. 13, 2018

(65) Prior Publication Data

US 2019/0249678 A1     Aug. 15, 2019

(51) Int. Cl.
F04D 27/00    (2006.01)
F04D 25/16    (2006.01)
G05B 15/02    (2006.01)

(52) U.S. Cl.
CPC ......... F04D 27/001 (2013.01); F04D 25/166 (2013.01); F04D 27/004 (2013.01); G05B 15/02 (2013.01)

(58) Field of Classification Search
CPC .... F04D 27/001; F04D 27/004; F04D 25/166; G05B 9/03
See application file for complete search history.

(56) References Cited

U.S. PATENT DOCUMENTS

| | | | | |
|---|---|---|---|---|
| 6,526,333 | B1* | 2/2003 | Henderson | G06F 1/20 700/300 |
| 2003/0234630 | A1* | 12/2003 | Blake | F04D 27/004 318/471 |
| 2007/0070994 | A1* | 3/2007 | Burroughs | G06F 1/206 370/381 |
| 2012/0173944 | A1* | 7/2012 | Pan | G06F 11/221 714/734 |

(Continued)

FOREIGN PATENT DOCUMENTS

| CN | 201134027 Y | 10/2008 |
|---|---|---|
| CN | 102213227 A | 10/2011 |

(Continued)

OTHER PUBLICATIONS

Extended European Search Report for EP Application No. 18182148.9, dated Dec. 18, 2018.

(Continued)

*Primary Examiner* — Robert E Fennema
*Assistant Examiner* — Marzia T Monty
(74) *Attorney, Agent, or Firm* — Nixon Peabody LLP; Zhou Lu (57) ABSTRACT

The present disclosure provides a system and method for controlling a plurality of cooling fan modules using a management controller and a multiplex switch. The multiplex switch connects the management controller to the plurality of cooling fan modules. The multiplex switch can enable the management controller to select a specific cooling fan module from the plurality of cooling fan modules. Once (Continued)

the specific cooling fan module is selected, the multiplex switch can connect to the specific cooling fan module, enable the management controller to monitor operating characteristics of the specific cooling fan module, and control power or current being delivered to the specific cooling fan module.

14 Claims, 7 Drawing Sheets

(56) References Cited

U.S. PATENT DOCUMENTS

2013/0131885 A1   5/2013   Huang et al.

FOREIGN PATENT DOCUMENTS

| CN | 103138940 A | 6/2013 |
|---|---|---|
| CN | 103138974 A | 6/2013 |
| JP | H02168880 A | 6/1990 |
| JP | 2009294957 A | 12/2009 |
| TW | 201631434 A | 9/2016 |
| TW | 201720282 A | 6/2017 |

OTHER PUBLICATIONS

Anonymous:"Shift Register—Parallel and Serial Shift Register", Nov. 18, 2016 (Nov. 18, 2016), XP055528597, Retrieved from the Internet: URL:https://web.archive.org/web/20161118213412/https://www.electronics-tutorials.ws/sequential/seq_5.html, [retrieved on Nov. 29, 2018].

TW Office Action for Application No. 107119656, dated Mar. 5, 2019, w/First Office Action Summary.

TW Search Report for Application No. 107119656, dated Mar. 5, 2019, w/ First Office Action.

JP Office Action for Application No. 2018-138147, dated Sep. 3, 2019, w/ First Office Action Summary.

\* cited by examiner

MANAGEMENT OF MULTIPLE FAN MODULES

FIELD OF THE INVENTION

The disclosure generally relates to temperature management in a computing system.

BACKGROUND

Modern computing systems comprise numerous electronic components such as CPUs, GPUs, RAM, etc. As computing systems become faster and more powerful (e.g., with smaller form factors and faster CPUs or GPUS), more heat is generated within the systems. Without adequate cooling, overheating may occur, and cause physical damage to components within the computing systems; and sometimes even lead to system failures and data losses.

Cooling fans are widely used to remove excessive heat from computing systems by actively exhausting accumulated hot air, thus maintaining suitable temperatures within the computing systems. Therefore, it is important to effectively control the cooling fans to keep internal temperatures of the computing systems within a certain range.

In conventional systems, a baseboard management controller (BMC) is typically used to control cooling fans by directly connecting the BMC to a control pin of each cooling fan. However, cooling fans inside a computing system can have various distances from the BMC. Further, this conventional control method requires a large number of wires to connect the BMC to the various cooling fans present in a conventional system.

Thus, there is a need to control cooling fan modules in a computing system with simpler and more efficient solutions.

SUMMARY

Systems and methods, in accordance with various examples of the present disclosure, provide a solution to the above-mentioned problems by controlling a plurality of cooling fan modules using a controller (e.g., BMC or rack management controller (RMC)) and a multiplex switch. The multiplex switch connects the controller to the plurality of cooling fan modules. The multiplex switch can enable the controller to select a specific cooling fan module from the plurality of cooling fan modules. Once the specific cooling fan module is selected, the multiplex switch can connect to the specific cooling fan module; enable the controller to monitor operating characteristics (e.g., speed and error message etc.) of the specific cooling fan module; and control power or current being delivered to the specific cooling fan module.

In some examples, the controller can effectively control the plurality of cooling fan modules via three connection links and the multiplex switch. The minimum three connection links include a fan selection link, a fan monitoring link, and a fan power control link.

In some implementations, the multiplex switch includes a first selection logic chip, a second selection logic chip, a first multiplexer, and a second multiplexer. The first and second selection logic chips are connected to the controller via the fan selection link; the first multiplexer is connected to the controller via the fan monitoring link; and the second multiplexer is connected to the controller via the fan power control link.

In some examples, the multiplex switch can receive serial inputs from the controller, and provide parallel-output-shift control of the plurality of cooling fan modules. For example, the multiplex switch can enable the controller to select a specific cooling fan within a predetermined range of time, and then connect and control the selected cooling fan.

In some implementations, the multiplex switch includes a plurality of MOSFETs. Each of the plurality of MOSFETs is connected to a corresponding one of the plurality of cooling fan modules. The controller can select and connect to a specific cooling fan module by switching on a corresponding MOSFET of the specific cooling fan module, via the fan selection link. Once the corresponding MOSFET is switched on, the controller can directly or indirectly monitor operating characteristics (e.g., speed and error message etc.) of the specific cooling fan module, and control power or current being delivered to the specific cooling fan module. For example, the controller can control power or current being delivered to the specific cooling fan module by sending a pulse-width-modulation (PWM) signal to the specific cooling fan module.

In some implementations, operation and maintenance history of the plurality of cooling fan modules can also be collected and stored on the server system. The controller can then use the operation and maintenance history of the plurality of cooling fan modules for effectively controlling the plurality of cooling fan modules. For example, the controller can control power or current being delivered to a specific cooling fan module based upon operating characteristics and/or the operation and maintenance history of the specific cooling fan module.

In accordance with one aspect of the present disclosure, a computer-implemented method for controlling a plurality of cooling fan modules of a server system, includes: selecting a specific cooling fan module from the plurality of cooling fan modules via a multiplex switch of the server system; connecting to the specific cooling fan module via the multiplex switch; monitoring operation characteristics of the specific cooling fan module; retrieving operation and maintenance characteristics of the specific cooling fan module; and controlling power or current being delivered to the specific cooling fan module based at least upon the operation characteristics and/or the operation and maintenance history of the specific cooling fan module.

In accordance with another aspect of the present disclosure, a non-transitory computer-readable storage medium storing instructions is provided. The instructions, when executed by a processor, cause the processor to perform operations including: selecting a specific cooling fan module from a plurality of cooling fan modules via a multiplex switch of a server system; connecting to the specific cooling fan module via the multiplex switch; monitoring operation characteristics of the specific cooling fan module; retrieving operation and maintenance characteristics of the specific cooling fan module; and controlling power or current being delivered to the specific cooling fan module based at least upon the operation characteristics and/or the operation and maintenance history of the specific cooling fan module.

According to some configurations, operation and maintenance history of the plurality of cooling fan modules can be stored on memory, hard drive, or a flash memory device of the server system. The operation and maintenance history of the plurality of cooling fan modules can be accessed by BMC, RMC, or a central processing unit (CPU) on the server system. The flash memory device can be any storage medium configured to store program instructions or data for a period of time. According to some examples, the flash storage device can be a flash drive, a random access memory (RAM), a non-volatile random-access memory (NVRAM), an electrically erasable programmable read-only memory (EEPROM), or a mailbox register.

Additional features and advantages of the disclosure will be set forth in the description which follows, and in part, will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. These drawings depict only example aspects of the disclosure and are not therefore to be considered to be limiting of its scope. The principles herein are described and explained with additional specificity and detail through the use of the accompanying drawings in which.

DETAILED DESCRIPTION

The present disclosure can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Various examples of the present disclosure provide systems and methods for controlling a plurality of cooling fan modules using a controller (e.g., BMC or rack management controller (RMC)) and a multiplex switch. The multiplex switch connects the controller to the plurality of cooling fan modules. The multiplex switch can enable the controller to select a specific cooling fan module from the plurality of cooling fan modules. Once the specific cooling fan module is selected, the multiplex switch can connect to the specific cooling fan module; enable the controller to monitor operating characteristics (e.g., speed and error message etc.) of the specific cooling fan module; and control power or current being delivered to the specific cooling fan module.

Figure 1A:
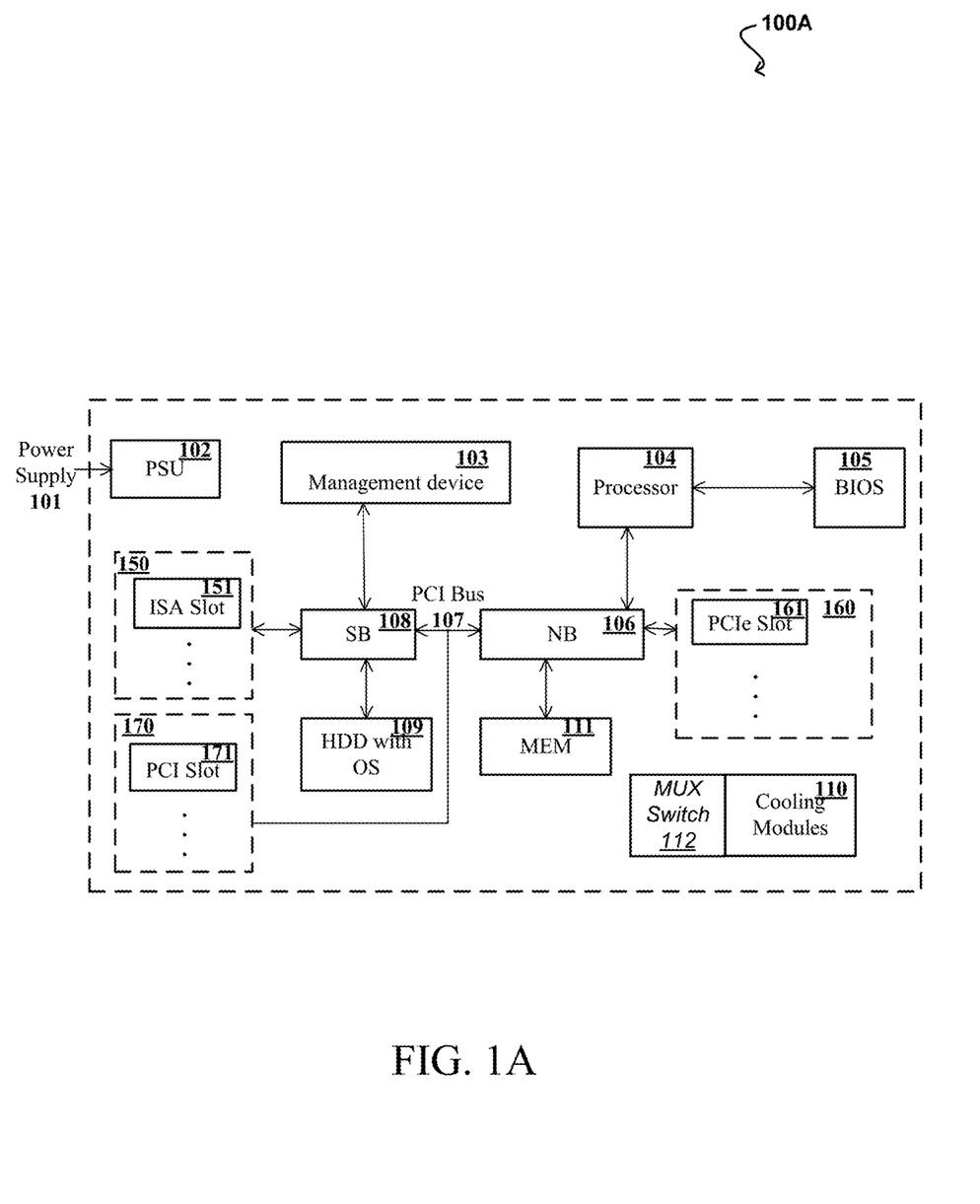
FIG. 1A is a schematic block diagram illustrating an exemplary system in a datacenter having multiple cooling fan modules, in accordance with an implementation of the present disclosure.

FIG. 1A is a schematic block diagram illustrating an exemplary server system 100A in a datacenter having multiple cooling fan modules, in accordance with an implementation of the present disclosure. In this example, the server system 100A includes at least one microprocessor or processor 104, one or more cooling modules 110, a main memory (MEM) 111, at least one power supply unit (PSU) 102 that receives an AC power from an AC power supply 101, and provide power to various components of the server system 100A, such as the processor 104, north bridge (NB) logic 106, PCIe slots 160, south bridge (SB) logic 108, storage device 109, ISA slots 150, PCI slots 170, a multiplex switch 112, and a management controller or device 103. After being powered on, the server system 100A is configured to load software application from memory, a computer storage device, or an external storage device to perform various operations. The storage device 109 is structured into logical blocks that are available to an operating system and applications of the server system 100A. The storage device 109 is configured to retain server data even when the server system 100A is powered off.

In FIG. 1A, the memory 111 is coupled to the processor 104 via the NB logic 106. The memory 111 may include, but is not limited to, dynamic random access memory (DRAM), double data rate DRAM (DDR DRAM), static RAM (SRAM), or other types of suitable memory. The memory 111 can be configured to store firmware data of the server system 100A. In some configurations, firmware data can be stored on the storage device 109.

In some implementations, the server system 100A can further comprise a flash storage device. The flash storage device can be a flash drive, a random access memory (RAM), a non-volatile random-access memory (NVRAM), or an electrically erasable programmable read-only memory (EEPROM). The flash storage device can be configured to store the system configurations such as firmware data.

The processor 104 can be a central processing unit (CPU) configured to execute program instructions for specific functions. For example, during a booting process, the processor 104 can access firmware data stored in the management device 103 or the flash storage device, and execute the BIOS 105 to initialize the server system 100A. After the booting process, the processor 104 can execute an operating system in order to perform and manage specific tasks for the server system 100A.

In some configurations, the processor 104 can be multi-core processors, each of which is coupled together through a CPU bus connected to the NB logic 106. In some configurations, the NB logic 106 can be integrated into the processor 104. The NB logic 106 can also be connected to a plurality of peripheral component interconnect express (PCIe) slots 160 and an SB logic 108 (optional). The plurality of PCIe slots 160 can be used for connections and buses such as PCI Express ×1, USB 2.0, SMBus, SIM card, future extension for another PCIe lane, 1.5 V and 3.3 V power, and wires to diagnostics LEDs on the server system 100A's chassis.

In system 100A, the NB logic 106 and the SB logic 108 are connected by a peripheral component interconnect (PCI) Bus 107. The PCI Bus 107 can support functions on the processor 104 but in a standardized format that is independent of any of the processor 104's native buses. The PCI Bus 107 can be further connected to a plurality of PCI slots 170 (e.g., a PCI slot 171). Devices connect to the PCI Bus 107 may appear to a bus controller (not shown) to be connected directly to a CPU bus, assigned addresses in the processor 104's address space, and synchronized to a single bus clock. PCI cards that can be used in the plurality of PCI slots 170 include, but are not limited to, network interface cards (NICs), sound cards, modems, TV tuner cards, disk controllers, video cards, small computer system interface (SCSI) adapters, and personal computer memory card international association (PCMCIA) cards.

The SB logic 108 can couple the PCI Bus 107 to a plurality of expansion cards or ISA slots 150 (e.g., an ISA slot 151) via an expansion bus. The expansion bus can be a bus used for communications between the SB logic 108 and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In this example, BIOS 105 can be any program instructions or firmware configured to initiate and identify various components of the server system 100A. The BIOS is an important system component that is responsible for initializing and testing hardware components of a corresponding server system. The BIOS can provide an abstraction layer for the hardware components thereby providing a consistent way for applications and operating systems to interact with a peripheral device such as a keyboard, a display, and other input/output devices.

In system 100A, the SB logic 108 is further coupled to the management device 103 that is connected to the at least one PSU 102 and the multiplex switch 112. In some implementations, the management device 103 can be a baseboard management controller (BMC) or a rack management controller (RMC).

The management device 103 (e.g., BMC) can communicate with the cooling modules 110 through the multiplex switch 112. The multiplex switch 112 can enable the management device 103 to select and connect to a specific cooling module from the cooling modules 110, monitor operating characteristics of the specific cooling module, and control power or current being delivered to the specific cooling module. For example, the management device 103 can control power or current being delivered to the specific cooling module by sending a pulse-width-modulation (PWM) signal to the specific cooling module based upon the operating characteristics of the specific cooling module.

In some configurations, the management device 103 is connected to the multiplex switch 112 via three connection links—including a fan selection link, a fan monitoring link, and a fan power control link. An example of this configuration is further illustrated in FIGS. 1B and 1C. In some implementations, the management device 103 is further connected to the multiplex switch 112 via a shift-register-clock link. An example of this configuration is further illustrated in FIG. 1D.

Figure 1B:
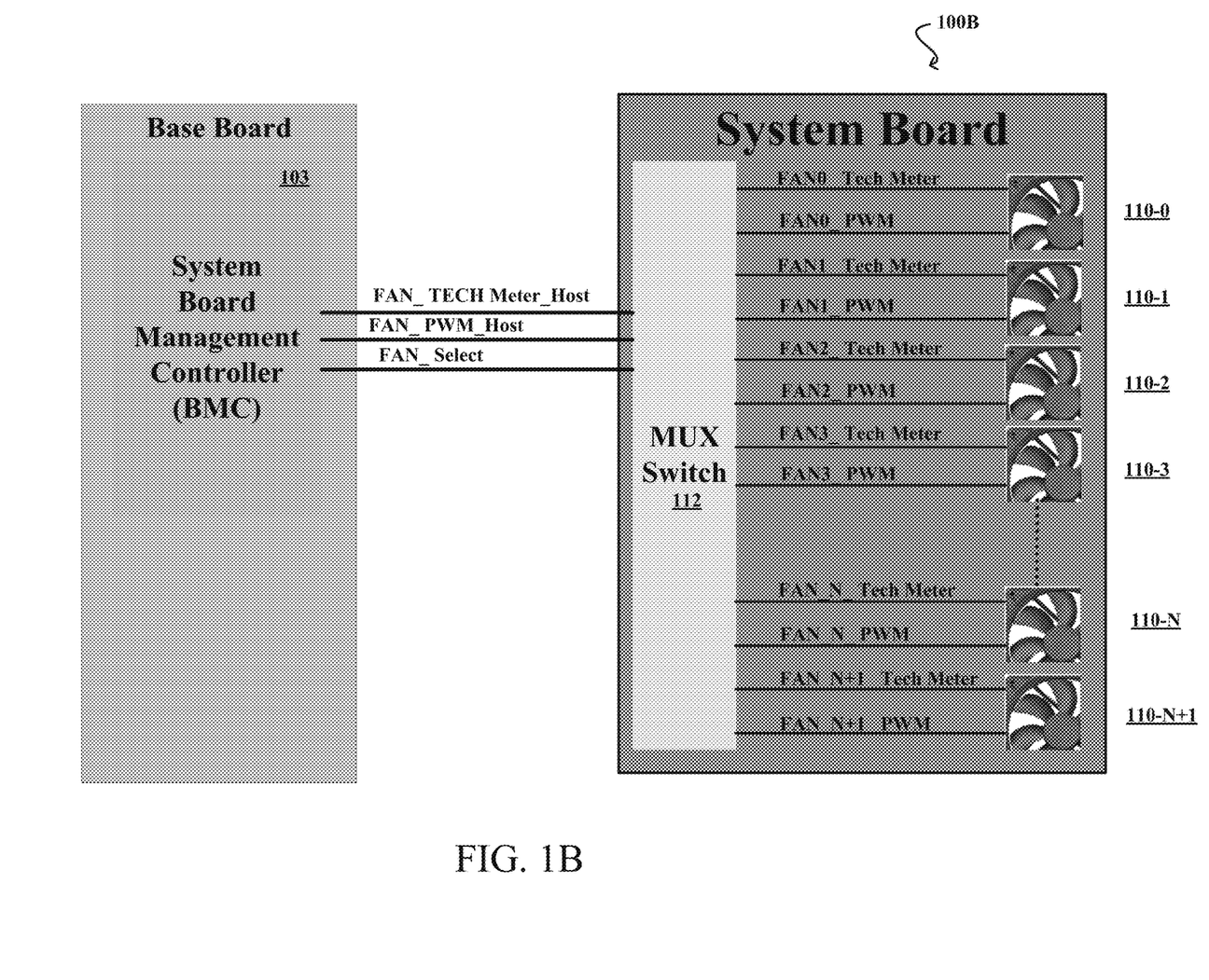
FIG. 1B is a schematic block diagram illustrating an exemplary system in FIG. 1A that includes a multiplex switch connected to multiple cooling fan modules, in accordance with an implementation of the present disclosure.
Figure 1C:
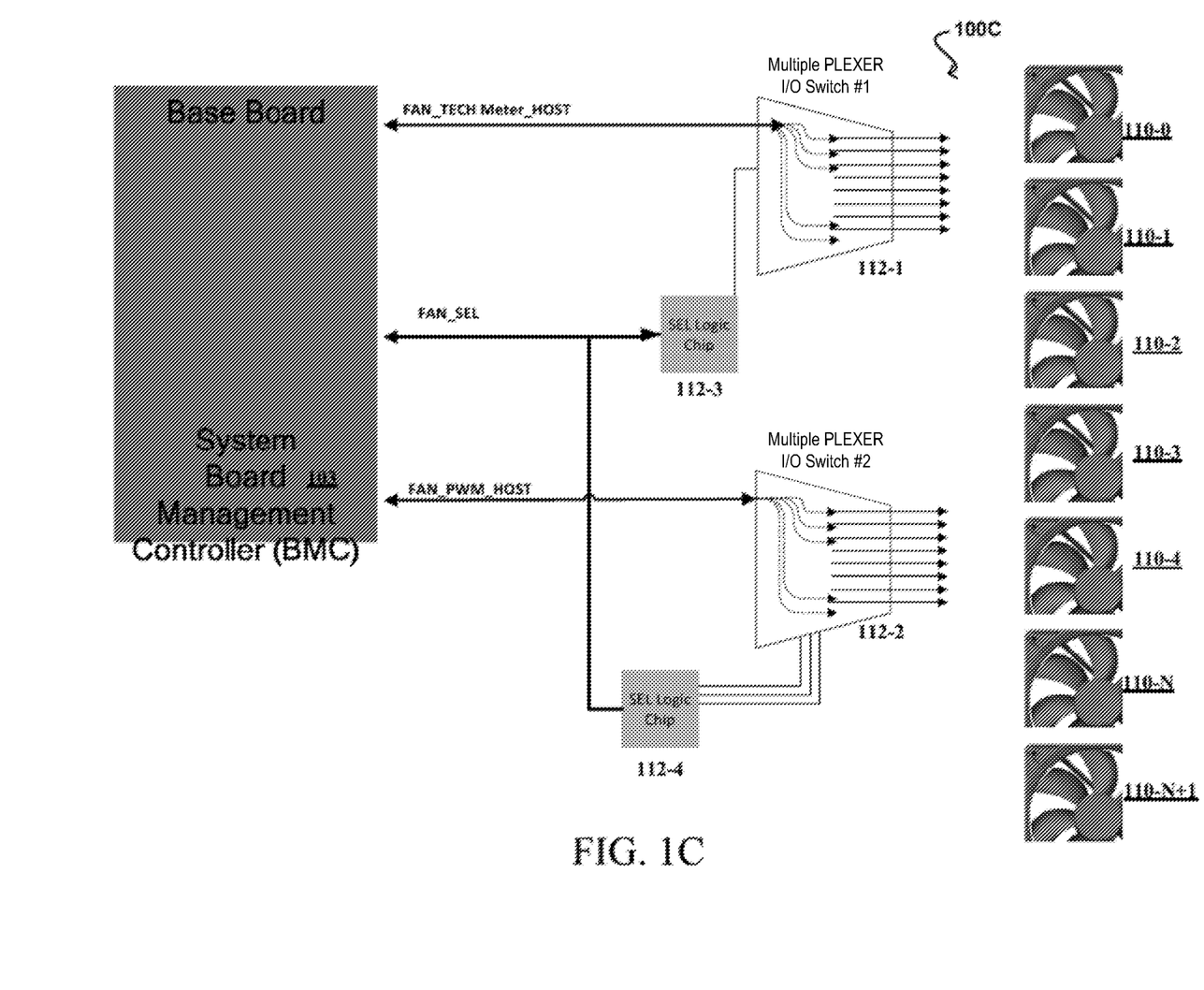
FIG. 1C is a schematic block diagram illustrating an exemplary multiplex switch in FIG. 1B that includes selection logic chips and multiplexes connected to multiple cooling fan modules, in accordance with an implementation of the present disclosure.
Figure 1D:
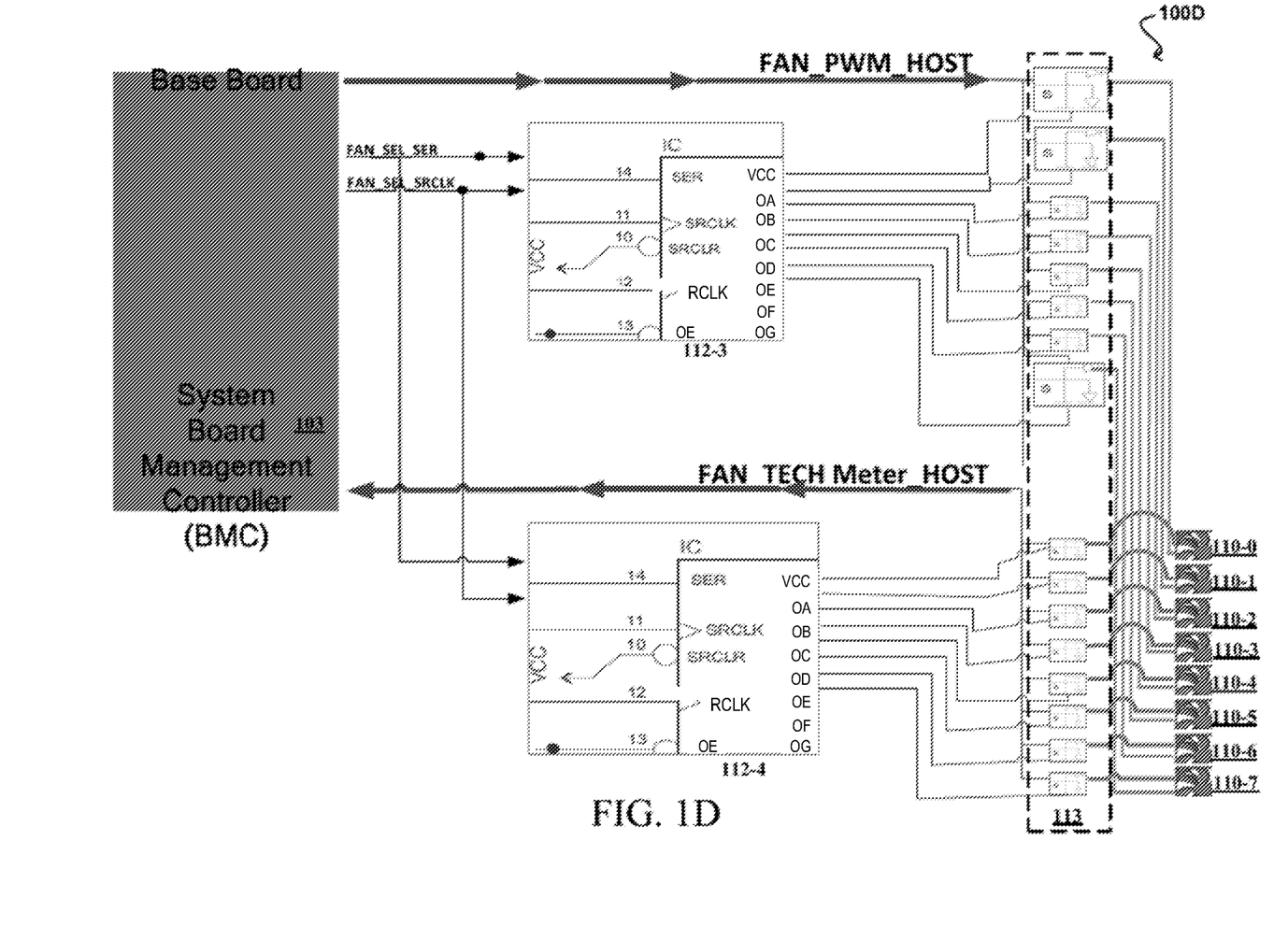
FIG. 1D is a schematic block diagram illustrating an exemplary system in FIG. 1A that enables a BMC to select a specific cooling fan module from a plurality of cooling fan modules via a fan selection link and a shift-register-clock link, in accordance with an implementation of the present disclosure.

In the example of FIG. 1D, discussed in greater detail below, the multiplex switch 112 can receive serial inputs from the management device 103 and provide parallel-output-shift control of the cooling modules 110. For example, the multiplex switch 112 can enable the management device 103 to select and connect to a specific cooling module within a predetermined range of time, and then control the selected cooling module.

In some implementations, the management device 103 can monitor and store operation and maintenance history of the cooling modules 110 on the server system 100A. The management device 103 can use the operation and maintenance history of the plurality of cooling fan modules for smartly and effectively controlling the cooling modules 110 (e.g., 110-0, 110-1, 110-2, 110-3 . . . 110-N, and 110-N+1 illustrated in FIG. 1B). For example, the management device 103 can control power or current being delivered to a specific cooling module based upon operating characteristics and/or the operation and maintenance history of the specific cooling module.

FIG. 1B is a schematic block diagram 100B illustrating a portion of an exemplary system 100A in FIG. 1A that includes the multiplex switch 112 connected to multiple cooling fan modules 110, in accordance with an implementation of the present disclosure. In this example, the multiplex switch 112 is connected to the BMC 103 via three connection links, i.e., Fan_Tech_Meter_Host, Fan_PWM_Host, and Fan_Select, and connected to the cooling fan modules (i.e., 110-0, 110-1, 110-2, 110-3 . . . 110-N, and 110-N+1) in parallel.

The multiplex switch 112 in FIG. 1B is further illustrated in FIG. 1C. In this example, the multiplex switch 112 comprises a first selection logic chip 112-3, a second selection logic chip 112-4, a first multiplexer 112-1, and a second multiplexer 112-2. The first and second selection logic chips 112-3 and 112-4, are connected to the BMC 103 via the fan selection link, Fan_Select. The first multiplexer 112-1 is connected to the BMC 103 via the fan monitoring link, Fan_Tech_Meter_Host. And, the second multiplexer 112-2 is connected to the BMC 103 via the fan power control link, Fan_PWM_Host.

As illustrated in FIG. 1C, the BMC 103 can select and connect to a specific cooling fan module via the fan selection link, Fan_Select, and the first and second selection logic chips 112-3 and 112-4. Once the specific cooling fan module is selected, the BMC 103 can collect operating characteristics (e.g., speed and error message etc.) of the specific cooling fan module via the first multiplexer 112-1, and the fan monitoring link, Fan_Tech_Meter_Host; and further control power or current being delivered to the specific cooling fan module via the fan power control link, Fan_PWM_Host, and the second multiplexer 112-2.

FIG. 1D is a schematic block diagram 100D illustrating an exemplary system in FIG. 1A that enables a BMC to select a specific cooling fan module from the cooling fan modules (i.e., 110-0, 110-1, 110-2, 110-3, 110-4, 110-5 . . . 110-6 and 110-7) via a Fan_Select link and a shift-register-clock link. In this example, the BMC 103 is connected to serial inputs of exemplary multiplexers 112-3 and 112-4, and connected to shift-register-clock inputs of the exemplary multiplexers 112-3 and 112-4. The exemplary multiplexers 112-3 and 112-4 are connected to the cooling fan modules (i.e., 110-0, 110-1, 110-2, 110-3, 110-4, 110-5 . . . 110-6 and 110-7) via a plurality of MOSFETs 113.

In this example, each of the plurality of MOSFETs 113 is connected to a corresponding one of the cooling fan modules (i.e., 110-0, 110-1, 110-2, 110-3, 110-4, 110-5 . . . 110-6 and 110-7). The BMC 103 can select and connect to a specific cooling fan module by switching on a corresponding MOSFET of the specific cooling fan module, via the fan selection link, FAN_SEL_SER. Once the corresponding MOSFET is switched on, the controller can monitor operating characteristics (e.g., speed and error message etc.) of the specific cooling fan module, and control power or current being delivered to the specific cooling fan module.

Figure 1E:
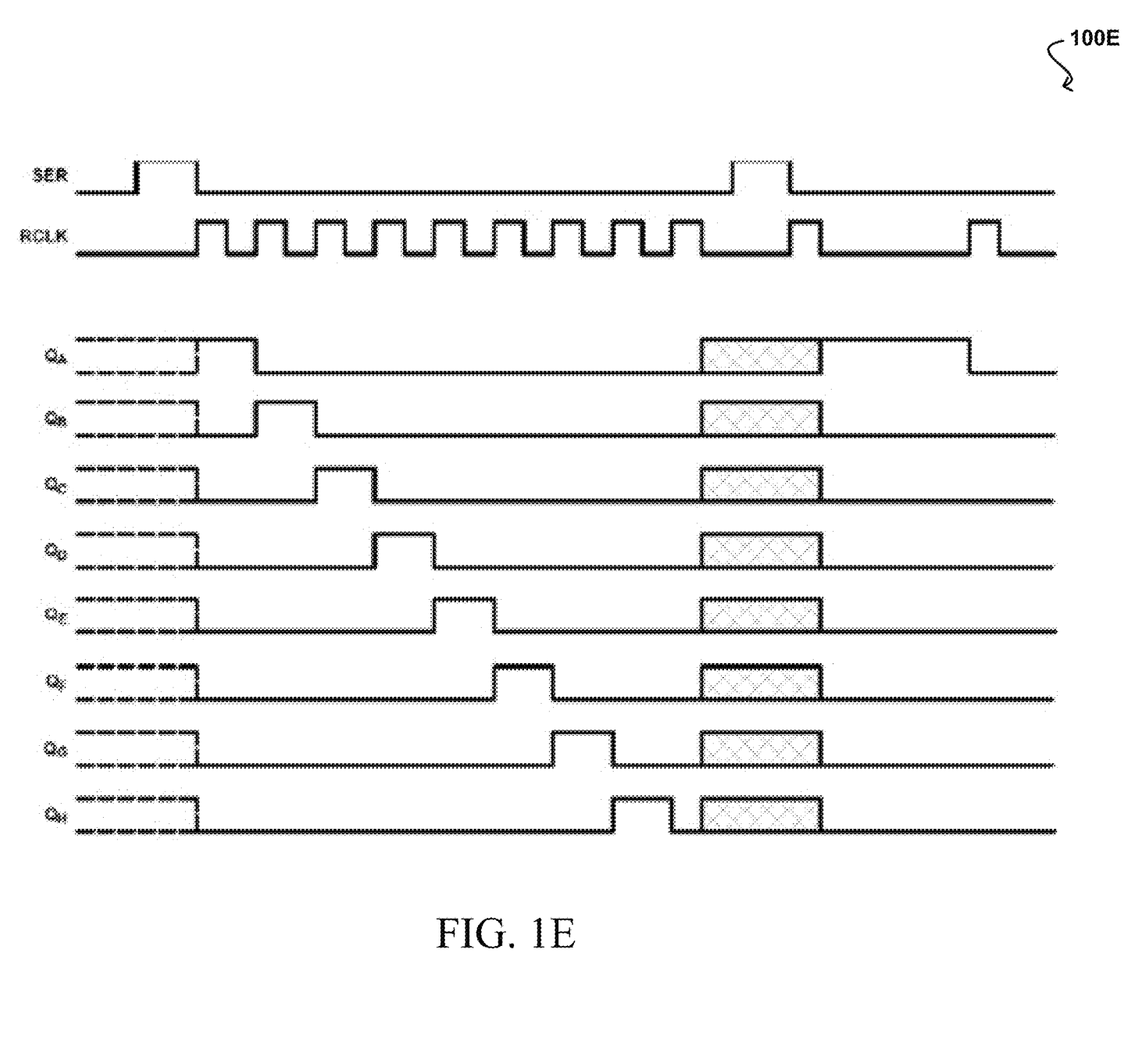
FIG. 1E is a timing diagram illustrating an exemplary system in FIG. 1D that enables a BMC to select a specific cooling fan module from a plurality of cooling fan modules via an 8-bit serial input and a shift register clock, in accordance with an implementation of the present disclosure.

FIG. 1E is a timing diagram 100E illustrating an exemplary system in FIG. 1D that enables a BMC to select a specific cooling fan module from the multiple cooling fan modules via an 8-bit serial input and a shift register clock, in accordance with an implementation of the present disclosure. In this example, an output $Q_A$ of the multiplexer 112-2 is switched to "high," in response to the fan selection "SER" is switched to "high" and a subsequent first "high" shift-register-clock, RCLK. The "high" output $Q_A$ can switch on a corresponding MOSFET of a first cooling fan module 110-0 in FIG. 1D. Then, the BMC 103 can monitor operating characteristics (e.g., speed and error message etc.) of the first cooling fan module 110-0, and control power or current being delivered to the first cooling fan module 110-0.

In response to the fan selection "SER" is switched to "high" and a subsequent second "high" shift-register-clock, RCLK, an output $Q_B$ of the multiplexer 112-2 is switched to "high." The "high" output $Q_B$ can switch on a corresponding MOSFET of a second cooling fan module 110-1 in FIG. 1D. The BMC 103 can then monitor operating characteristics (e.g., speed and error message etc.) of the first cooling fan module 110-1, and control power or current being delivered to the first cooling fan module 110-1. The same process can be repeated and applied to $Q_C$ to $Q_H$, and enables the BMC 103 to monitor and control corresponding cooling fan modules 110-2 to 110-7, respectively.

As illustrated in FIG. 1E, the BMC 103 is enabled to monitor and control 8 cooling fan modules within 8 clock cycles of the shift-register-clock, RCLK. As a result, BMC or RMC in the server system 100A can effectively monitor and control cooling modules 110 by implementing the present disclosure.

Although only certain components are shown within the exemplary systems 100A-100D in FIGS. 1A-1D, respectively, various types of electronic or computing components that are capable of processing or storing data, receiving or transmitting signals, or providing fresh air to downstream components, can also be included in the exemplary systems 100A-100D. Further, the electronic or computing components in the exemplary systems 100A-100D can be configured to execute various types of application, and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the exemplary systems 100A-100D, a variety of networking and messaging protocols can be used, including but not limited to TCP/IP, open systems interconnection (OSI), file transfer protocol (FTP), universal plug and play (UpnP), network file system (NFS), common internet file system (CIFS), Apple-Talk etc. As would be appreciated by those skilled in the art, the exemplary systems 100A-100D illustrated in FIGS. 1A-1D, respectively, are used for purposes of explanation. Therefore, a network system can be implemented with many variations, as appropriate, yet still provide a configuration of network platform in accordance with various examples of the present disclosure.

In exemplary configurations of FIGS. 1A-1D, respectively, the exemplary systems 100A-100D can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art. Various other elements and/or combinations are possible as well within the scope of various examples.

The above discussion is meant to be illustrative of the principles and various examples of the present disclosure. Numerous variations and modifications will become apparent once the above disclosure is fully appreciated.

Figure 2:
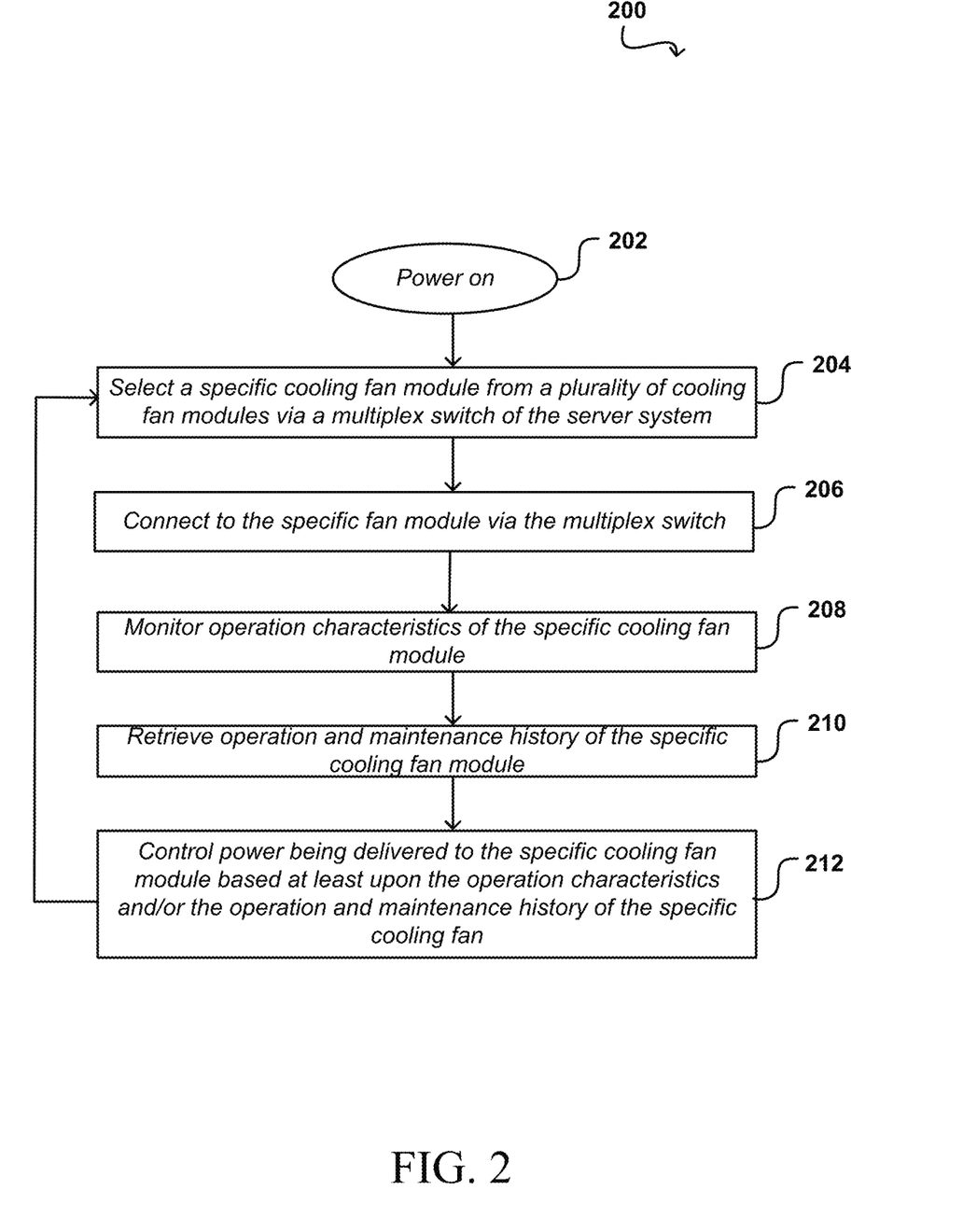
FIG. 2 is an exemplary method for effectively controlling cooling fan modules, in accordance with an implementation of the present disclosure.

FIG. 2 is an exemplary method 200 for effectively controlling cooling fan modules of a server system in accordance with an implementation of the present disclosure. It should be understood that the exemplary method 200 is presented solely for illustrative purposes, and that in other methods in accordance with the present disclosure can include additional, fewer, or alternative steps performed in similar or alternative orders, or in parallel. The exemplary method 200 starts at step 202 by powering on the server system.

At step 204, a management controller of the server system can select a specific cooling fan module from a plurality of cooling fan modules of the server system via a multiplex switch of the server system, as illustrated in FIGS. 1A-1D. In some examples, the management controller can select the specific cooling fan module via a fan selection link, and the multiplex switch. The multiplex switch is connected to the plurality of cooling fan modules.

At step 206, the management controller can connect to the specific cooling fan module via the multiplex switch, as illustrated in FIGS. 1A-1D. In some examples, the multiplex switch includes a first selection logic chip, a second selection logic chip, a first multiplexer and a second multiplexer. The first and second selection logic chips are connected to the management controller via the fan selection link, the first multiplexer is connected to the management controller via the fan monitoring link, and the second multiplexer is connected to the management controller via the fan power control link.

In some examples, the multiplex switch can receive serial inputs from the management controller and provide parallel-output-shift control of the plurality of cooling fan modules. For example, the multiplex switch can enable the management controller to select and connect to a specific cooling fan within a predetermined range of time.

In some implementations, the multiplex switch comprises a plurality of MOSFETs. Each of the plurality of MOSFETs is connected to a corresponding one of the plurality of cooling fan modules. The management controller can select a specific cooling fan module by switching on a corresponding MOSFET of the specific cooling fan module, via the fan selection link. Once the corresponding MOSFET is switched on, the management controller can connect to the specific cooling fan module.

At step 208, the management controller can monitor operating characteristics (e.g., speed and error message etc.) of the specific cooling fan module via the multiplex switch, and a fan monitoring link, as illustrated in FIGS. 1A-1D.

At step 210, the management controller can further retrieve operation and maintenance history of the plurality of cooling fan modules on the server system. At Step 212, the management controller can control power or current being delivered to the specific cooling fan module based upon operating characteristics of the specific cooling fan module, and/or the operation and maintenance history of the specific cooling fan module.

Figure 3:
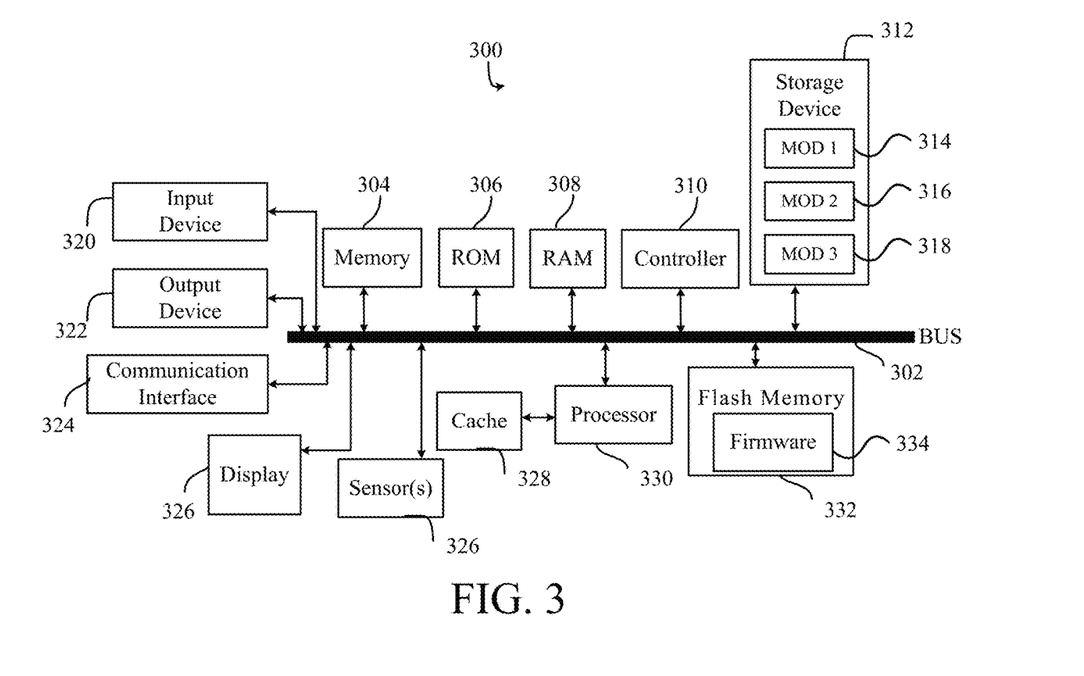
FIGS. 3 and 4 illustrate exemplary systems, in accordance with various examples of the present disclosure.
Figure 4:
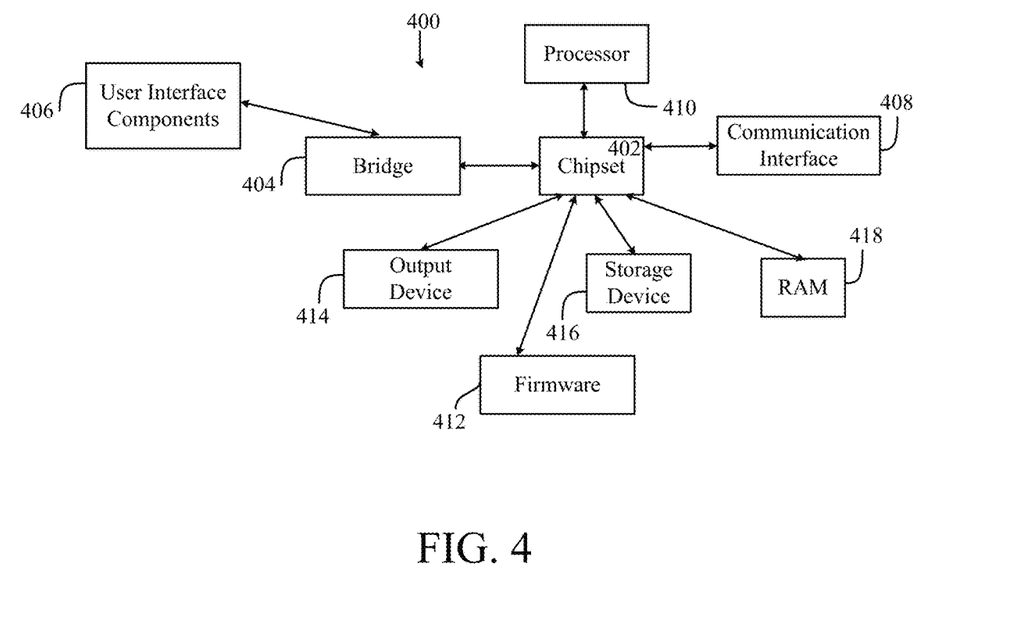

A brief introductory description of example systems and networks, as illustrated in FIGS. 3-4, is disclosed herein. These variations shall be described herein as the various examples are set forth. The present disclosure now turns to FIG. 3.

FIG. 3 illustrates an example computing system 300, in which components of the computing system are in electrical communication with each other using a bus 302. The system 300 includes a processing unit (CPU or processor) 330, and the bus 302 that couples various system components, including a system memory 304 (e.g., read only memory (ROM) 306 and random access memory (RAM) 308), to the processor 330. The system 300 can include a cache of high-speed memory connected directly with, in close proximity to, or integrated as part of the processor 330. The system 300 can copy data from the system memory 304 and/or the storage device 312 to the cache 328 for quick access by the processor 330. In this way, the cache can provide a performance boost for processor 330 while waiting for data. These and other modules can control or be configured to control the processor 330 to perform various actions. Other system memory 304 may be available for use as well. The system memory 304 can include multiple different types of memory with different performance characteristics. The processor 330 can include any general purpose processor and a hardware module or software module, such as module 1 314, module 2 316, and module 3 318 embedded in storage device 312. The hardware module or software module is configured to control the processor 330, as well as a special-purpose processor where software instructions are incorporated into the actual processor design. The processor 330 may essentially be a completely self-contained computing system, and containing multiple cores or processors, a bus, memory controller, cache, etc. A multi-core processor may be symmetric or asymmetric.

To enable user interaction with the computing device 300, an input device 320 is provided as an input mechanism. The input device 320 can comprise a microphone for speech, a touch-sensitive screen for gesture or graphical input, keyboard, mouse, motion input, and so forth. In some instances, multimodal systems can enable a user to provide multiple types of input to communicate with the system 300. In this example, an output device 322 is also provided. The communications interface 324 can govern and manage the user input and system output.

Storage device 312 can be a non-volatile memory to store data that are accessible by a computer. The storage device 312 can be magnetic cassettes, flash memory cards, solid state memory devices, digital versatile disks, cartridges, random access memories (RAMs) 308, read only memory (ROM) 306, and hybrids thereof.

The controller 310 can be a specialized microcontroller or processor on the system 300, such as a BMC (baseboard management controller). In some cases, the controller 310 can be part of an Intelligent Platform Management Interface (IPMI). Moreover, in some cases, the controller 310 can be embedded on a motherboard or main circuit board of the system 300. The controller 310 can manage the interface between system management software and platform hardware. The controller 310 can also communicate with various system devices and components (internal and/or external), such as controllers or peripheral components, as further described below.

The controller 310 can generate specific responses to notifications, alerts, and/or events, and communicate with remote devices or components (e.g., electronic mail message, network message, etc.) to generate an instruction or command for automatic hardware recovery procedures, etc. An administrator can also remotely communicate with the controller 310 to initiate or conduct specific hardware recovery procedures or operations, as further described below.

The controller 310 can also include a system event log controller and/or storage for managing and maintaining events, alerts, and notifications received by the controller 310. For example, the controller 310 or a system event log controller can receive alerts or notifications from one or more devices and components, and maintain the alerts or notifications in a system event log storage component.

Flash memory 332 can be an electronic non-volatile computer storage medium or chip that can be used by the system 300 for storage and/or data transfer. The flash memory 332 can be electrically erased and/or reprogrammed. Flash memory 332 can include EPROM (erasable programmable read-only memory), EEPROM (electrically erasable programmable read-only memory), ROM, NVRAM, or CMOS (complementary metal-oxide semiconductor), for example. The flash memory 332 can store the firmware 334 executed by the system 300, when the system 300 is first powered on, along with a set of configurations specified for the firmware 334. The flash memory 332 can also store configurations used by the firmware 334.

The firmware 334 can include a Basic Input/Output System or equivalents, such as an EFI (Extensible Firmware Interface) or UEFI (Unified Extensible Firmware Interface). The firmware 334 can be loaded and executed as a sequence program each time the system 300 is started. The firmware 334 can recognize, initialize, and test hardware present in the system 300 based on the set of configurations. The firmware 334 can perform a self-test, such as a POST (Power-on-Self-Test), on the system 300. This self-test can test functionality of various hardware components such as hard disk drives, optical reading devices, cooling devices, memory modules, expansion cards, and the like. The firmware 334 can address and allocate an area in the system memory 304, ROM 306, RAM 308, and/or storage device 312, to store an operating system (OS). The firmware 334 can load a boot loader and/or OS, and give control of the system 300 to the OS.

The firmware 334 of the system 300 can include a firmware configuration that defines how the firmware 334 controls various hardware components in the system 300. The firmware configuration can determine the order in which the various hardware components in the system 300 are started. The firmware 334 can provide an interface, such as an UEFI, that allows a variety of different parameters to be set, which can be different from parameters in a firmware default configuration. For example, a user (e.g., an administrator) can use the firmware 334 to specify clock and bus speeds; define what peripherals are attached to the system 300; set monitoring of health (e.g., fan speeds and CPU temperature limits); and/or provide a variety of other parameters that affect overall performance and power usage of the system 300. While firmware 334 is illustrated as being stored in the flash memory 332, one of ordinary skill in the art will readily recognize that the firmware 334 can be stored in other memory components, such as memory 304 or ROM 306.

System 300 can include one or more sensors 326. The one or more sensors 326 can include, for example, one or more temperature sensors, thermal sensors, oxygen sensors, chemical sensors, noise sensors, heat sensors, current sensors, voltage detectors, air flow sensors, flow sensors, infrared thermometers, heat flux sensors, thermometers, pyrometers, etc. The one or more sensors 326 can communicate with the processor, cache 328, flash memory 332, communications interface 324, system memory 304, ROM 306, RAM 308, controller 310, and storage device 312, via the bus 302, for example. The one or more sensors 326 can also communicate with other components in the system via one or more different means, such as inter-integrated circuit (I2C), general purpose output (GPO), and the like. Different types of sensors (e.g., sensors 326) on the system 300 can also report to the controller 310 on parameters, such as cooling fan speeds, power status, operating system (OS) status, hardware status, and so forth.

FIG. 4 illustrates an example computer system 400 having a chipset architecture that can be used in executing the described method(s) or operations, and in generating and displaying a graphical user interface (GUI). Computer system 400 can include computer hardware, software, and firmware that can be used to implement the disclosed technology. System 400 can include a processor 410, representative of a variety of physically and/or logically distinct resources capable of executing software, firmware, and hardware configured to perform identified computations. Processor 410 can communicate with a chipset 402 that can control input to and output from processor 410. In this example, chipset 402 outputs information to output device 414, such as a display, and can read and write information to storage device 416, which can include magnetic media, and solid state media, for example. Chipset 402 can also read data from and write data to RAM 418. A bridge 404 for interfacing with a variety of user interface components 406, can be provided for interfacing with chipset 402. Such user interface components 406 can include a keyboard, a microphone, touch detection and processing circuitry, a pointing device, such as a mouse, and so on. In general, inputs to system 400 can come from any of a variety of sources, machine generated and/or human generated.

Chipset 402 can also interface with one or more communication interfaces 408 that can have different physical interfaces. Such communication interfaces can include interfaces for wired and wireless local area networks, for broadband wireless networks, and for personal area networks. Further, the machine can receive inputs from a user via user interface components 406 and execute appropriate functions, such as browsing functions by interpreting these inputs using processor 410.

Moreover, chipset 402 can also communicate with firmware 412, which can be executed by the computer system 400 when powering on. The firmware 412 can recognize, initialize, and test hardware present in the computer system 400 based on a set of firmware configurations. The firmware 412 can perform a self-test, such as a POST, on the system 400. The self-test can test the functionality of the various hardware components 402-418. The firmware 412 can address and allocate an area in the memory 418 to store an OS. The firmware 412 can load a boot loader and/or OS, and give control of the system 400 to the OS. In some cases, the firmware 412 can communicate with the hardware components 402-410 and 414-418. Here, the firmware 412 can communicate with the hardware components 402-410 and 414-418 through the chipset 402, and/or through one or more other components. In some cases, the firmware 412 can communicate directly with the hardware components 402-410 and 414-418.

It can be appreciated that example systems 300 and 400 can have more than one processor (e.g., 330, 410), or be part of a group or cluster of computing devices networked together to provide greater processing capability.

For clarity of explanation, in some instances, the present disclosure may be presented as including individual functional blocks including functional blocks, including devices, device components, steps or routines in a method embodied in software, or combinations of hardware and software.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources used, can be accessible over a network. The computer executable instructions may be, for example, binaries and intermediate format instructions, such as assembly language, firmware, or source code.

Devices implementing methods according to these disclosures can include hardware, firmware and/or software, and can take any of a variety of form factors. Typical examples of such form factors include laptops, smart phones, small form factor personal computers, personal digital assistants, rack-mount devices, standalone devices, and so on. Functionality described herein also can be embodied in peripherals or add-in cards. Such functionality can also be implemented on a circuit board among different chips, or different processes executing in a single device, by way of further example.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless, and handheld devices running mobile software, and capable of supporting a number of networking and messaging protocols. Such a system can also include a number of workstations running any of a variety of commercially-available operating systems, and other known applications for purposes such as development and database management. These devices can also include other electronic devices, such as dummy terminals, thin-clients, gaming systems, and other devices capable of communicating via a network.

To the extent examples, or portions thereof, are implemented in hardware, the present disclosure can be implemented with any, or a combination of, the following technologies: a discrete logic circuit(s) having logic gates for implementing logic functions upon data signals; an application specific integrated circuit (ASIC) having appropriate combinational logic gates; programmable hardware such as a programmable gate array(s) (PGA); and/or a field programmable gate array (FPGA); etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network, and any combination thereof.

Devices implementing methods, according to these technologies, can include hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips, or different processes executing in a single device, by way of further example.

In examples that utilize a Web server, the Web server can run any variety of server or mid-tier applications, including HTTP servers, FTP servers, CGI servers, data servers, Java servers, and business application servers. In response to requests from user devices, the Web server(s) can also be capable of executing programs or scripts. For example, the Web server can execute one or more Web applications, which can be implemented as one or more scripts or programs written in any programming language, such as Java®, C, C# or C++ or any scripting language, such as Perl, Python or TCL, as well as combinations thereof. The Web server(s) can also encompass database servers, including those commercially available on the open market.

The server system can include a variety of data stores and other memory and storage media, as discussed above. These can reside in a variety of locations, such as on a storage medium local to (and/or resident in) one or more of the computers, or remote from any or all of the computers across the network. In a particular set of examples, the information can reside in a storage-area network (SAN) familiar to those skilled in the art. Similarly, any necessary files for performing the functions attributed to the computers, servers, or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad), and at least one output device (e.g., a display device, printer or speaker). Such a system can also include one or more storage devices, such as disk drives, optical storage devices, and solid-state storage devices such as random access memory (RAM) or read-only memory (ROM), as well as removable media devices, memory cards, flash cards, etc.

Storage media and computer readable media for containing code, or portions of code, can include any appropriate media known or used in the art, including storage media and computing media. The storage media and computing media can include, but are not limited to, removable and non-removable media for storage and/or transmission of data or information. The removable and non-removable media comprise RAM, ROM, EPROM, EEPROM, flash memory or other memory technology, CD-ROM, digital versatile disk (DVD) or other optical storage, magnetic cassettes, magnetic tape, magnetic disk storage, or other magnetic storage devices that can be used to store the desired information and that can be accessed by a system device. The data or information can include computer readable instructions, data structures, program modules, or other data. Based on the technology and teachings provided herein, a person of ordinary skill in the art will appreciate other ways and/or methods to implement the various aspects of the present disclosure.

The specification and drawings are, accordingly, to be regarded in an illustrative rather than a restrictive sense. It will, however, be evident that various modifications and changes can be made thereunto without departing from the broader spirit and scope of the patent application, as set forth in the claims.

What is claimed is:

1. A computer-implemented method for controlling a plurality of cooling fan modules of a server system, comprising:
    selecting, by a management controller of the server system, a specific cooling fan module from the plurality of cooling fan modules via a multiplex switch of the server system;
    connecting to the specific cooling fan module via the multiplex switch;
    monitoring operation characteristics of the specific cooling fan module;
    and
    controlling power or current being delivered to the specific cooling fan module based at least upon the operation characteristics of the specific cooling fan module,
    wherein the management controller is connected to the multiplex switch via three connection links including a fan selection link, a fan monitoring link, and a fan power control link,
    wherein the multiplex switch includes a first selection logic chip, a second selection logic chip, a first multiplexer and a second multiplexer, and wherein the first selection logic chip and the second selection logic chip are connected to the controller via the fan selection link, the first multiplexer is connected to the controller via the fan monitoring link, and the second multiplexer is connected to the controller via the fan power control link.

2. The computer-implemented method of claim 1, comprising:
    retrieving operation and maintenance history of the plurality of cooling fan modules; and
    controlling power or current being delivered to the specific cooling fan module based at least upon the operation characteristics of the specific cooling fan module, and the operation and maintenance history of the specific cooling fan module.

3. The computer-implemented method of claim 1, wherein the multiplex switch further comprises a plurality of MOSFETs, each of the plurality of MOSFETs being connected to a corresponding one of the plurality of cooling fan modules.

4. The computer-implemented method of claim 3, wherein connecting to the specific cooling fan module comprises switching on a corresponding MOSFET connected to the specific cooling fan module.

5. The computer-implemented method of claim 1, wherein the management controller is further connected to the multiplex switch via a shift-register-clock link; and wherein selecting, by the management controller of the server system, the specific cooling fan module comprises selecting the specific cooling fan module via the fan selection link, and the shift-register-clock link.

6. The computer-implemented method of claim 1, wherein controlling power or current being delivered to the specific cooling fan module comprises sending a pulse-width-modulation (PWM) signal to the specific cooling fan module.

7. A system, comprising:
   a processor;
   a management controller;
   a multiplex switch; and
   a computer-readable medium storing instructions that, when executed by the processor, cause the system to perform operations comprising:
      selecting, by the management controller of the system, a specific cooling fan module from a plurality of cooling fan modules via the multiplex switch;
      connecting to the specific cooling fan module via the multiplex switch;
      monitoring operation characteristics of the specific cooling fan module; and
      controlling power or current being delivered to the specific cooling fan module based at least upon the operation characteristics of the specific cooling fan module,
   wherein the management controller is connected to the multiplex switch via three connection links including a fan selection link, a fan monitoring link, and a fan power control link,
      wherein the multiplex switch includes a first selection logic chip, a second selection logic chip, a first multiplexer and a second multiplexer, and wherein the first selection logic chip and the second selection logic chip are connected to the controller via the fan selection link, the first multiplexer is connected to the controller via the fan monitoring link, and the second multiplexer is connected to the controller via the fan power control link.

8. The system of claim 7, wherein the computer-readable medium storing instructions that, when executed by the processor, further cause the system to perform operations comprising:
   retrieving operation and maintenance history of the plurality of cooling fan modules; and
   controlling power or current being delivered to the specific cooling fan module based at least upon the operation characteristics of the specific cooling fan module, and the operation and maintenance history of the specific cooling fan module.

9. The system of claim 7, wherein the multiplex switch further comprises a plurality of MOSFETs, each of the plurality of MOSFETs being connected to a corresponding one of the plurality of cooling fan modules.

10. The system of claim 9, wherein connecting to the specific cooling fan module comprises switching on a corresponding MOSFET connected to the specific cooling fan module.

11. The system of claim 7, wherein the management controller is further connected to the multiplex switch via a shift-register-clock link; and wherein selecting, by the management controller of the server system, the specific cooling fan module comprises selecting the specific cooling fan module via the fan selection link, and the shift-register-clock link.

12. The system of claim 7, wherein controlling power or current being delivered to the specific cooling fan module comprises sending a pulse-width-modulation (PWM) signal to the specific cooling fan module.

13. A non-transitory computer-readable storage medium including instructions that, when executed by at least one processor of a server system, cause the server system to perform operations comprising:
   selecting, by a management controller of the server system, a specific cooling fan module from a plurality of cooling fan modules via a multiplex switch of the server system;
   connecting to the specific cooling fan module via the multiplex switch;
   monitoring operation characteristics of the specific cooling fan module;
   and
      controlling power or current being delivered to the specific cooling fan module based at least upon the operation characteristics of the specific cooling fan module,
   wherein the management controller is connected to the multiplex switch via three connection links including a fan selection link, a fan monitoring link, and a fan power control link,
   wherein the multiplex switch includes a first selection logic chip, a second selection logic chip, a first multiplexer and a second multiplexer, and wherein the first selection logic chip and the second selection logic chip are connected to the controller via the fan selection link, the first multiplexer is connected to the controller via the fan monitoring link, and the second multiplexer is connected to the controller via the fan power control link.

14. The non-transitory computer-readable storage medium of claim 13, wherein the instructions, when executed by at least one processor of a server system, further cause the server system to perform operations comprising:
   retrieving operation and maintenance history of the plurality of cooling fan modules; and
   controlling power or current being delivered to the specific cooling fan module based at least upon the operation characteristics of the specific cooling fan module, and the operation and maintenance history of the specific cooling fan module.

* * * * *